(12) United States Patent
Rheaume

(10) Patent No.: US 8,433,550 B2
(45) Date of Patent: Apr. 30, 2013

(54) REQUIREMENTS DRIVEN FEATURE DEVELOPMENT PROCESS

(75) Inventor: Douglas P. Rheaume, Chesterfield, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 597 days.

(21) Appl. No.: 12/713,566

(22) Filed: Feb. 26, 2010

(65) Prior Publication Data

US 2011/0213596 A1 Sep. 1, 2011

(51) Int. Cl.
G06G 7/48 (2006.01)

(52) U.S. Cl.
USPC .............................................................. 703/8

(58) Field of Classification Search .................... None
See application file for complete search history.

(56) References Cited

PUBLICATIONS

Dziobek et al.; Autosar in the development process—procedure for introducing model-based AUTOSAR function development into production projects, dSPACE Magazine, Jan. 2008; pp. 6-13.*
Popp et al. (including Di Natale): Towards a Methodology for the Quantitative Evaluation of Automotive Architectures; 978-3-9810801-2-4/DATE07 © 2007 EDAA; Apr. 2007; pp. 504-509.*
Di Natale (2007): Virtual Platforms and Timing Analysis: Status, Challenges and Future Directions (DAC 2007, Jun. 4-8, 2007, San Diego; 2007 ACM; pp. 551-555.*
Ambler; Agile Modeling: Effective Practices for eXtreme Programming and the Unified Process;Wiley; 402 pages; 2002.*
DOD: Systems Engineering Fundamentals; Defense Acquisition University Press, Fort Belvoir, Virginia 22060-5565; 222 pages; 2001.*
Cho et al.; Enabling Technologies of Agile Manufacturing and Its Related Activities in Korea; Computers ind. Engng. vol. 30, No. 3, pp. 323-334, 1996; Copyright © 1996 Elsevier Science Ltd.*
Autosar 1: Autosar Modeling Guidelines of Basic Software EA UML Model V1.3.0 R4.0 Rev 1; Mar. 2009; pp. 1-45.*
Furst; AUTOSAR—An open standardized software architecture for the automotive industry, BMW 1st AUTOSAR Open Conference & 8th AUTOSAR Premium Member Conference; 2008, Cobo Center, Detroit, MI, USA; pp. 1-69.*
Rai et al.; Model-Based Development of AUTOSAR Compliant Applications: Exterior Lights Module Case Study; In-Vehicle Networks and Software, 2008 (SP-2197); pp. 1-10.*
Autosar 2: Autosar Specification of Platform Types; product information; V2.0.0; Jul. 2006; pp. 1-30.*
Vitkin et al.; The Role of the Data Dictionary in the Model-Based Development Process; SAE 2009-01-0919; Jan. 2009; pp. 1-8.*
Paul et al.; AUTOSAR System Modeling in IBM Rational Systems Developer; IBM publication; 2007; pp. 1-15.*
Vo et al.; Building Automotive Software Component within the AutoSAR Environment—A case study; IEEE 2009 Ninth International Conference on Quality Software; Aug. 2009; pp. 191-200.*

* cited by examiner

Primary Examiner — Hugh Jones
(74) Attorney, Agent, or Firm — John A. Miller; Miller IP Group, PLC

(57) ABSTRACT

A method for developing features to be used in an automobile design. The features are developed and documented in an architecture-independent manner, so that they can be used on any vehicle platform where appropriate. The feature development process includes using requirements which have been defined using formal methods, thereby assuring the quality of the requirements. The feature development process also includes the documentation and standardized use of all technical terms and data elements, the development of computer simulation models and hardware-in-the-loop simulations to verify the requirements, and review of a feature and its requirements by peer groups at various stages of the process. The result is a Feature Technical Specification which can be used by any product development team, and which contains only clear, concise and accurate requirements.

17 Claims, 9 Drawing Sheets

Data Item Details

| Attributes Status | R/Y/G | | Attributes Type | | | |
|---|---|---|---|---|---|---|
| | | | Basic | * | Min | Optional | Rest |

| | | | |
|---|---|---|---|
| Name:* | ABC_MaxSpeed | Data Item Category:* | Constant |
| Description:* | Maximum Allowable Speed for ABC | | |
| Type: | UFIX32_01 | Resolution: | 0.5 |
| Min Value: | 0.0 | Max Value: | 2147483648.0 |
| Initial Value: | 2 | Fail Soft Value: | |
| ☐ Array | Dimensions: | | |
| Descriptive Name: | ABC_MaxSpeed | Domain | |
| ☐ is Trigger | | | |
| Owner Function: | | Owner Feature: | ADAPTIVE BASIC CONTROL |
| Memory: | | Consumer Functions: | |
| Scale: | | Size (in Bits): | |
| Identifier: | 234 | Period (in msec): | |
| Owner: | John Q. Smith | | Version: 1.00 |

REQUIREMENTS DRIVEN FEATURE DEVELOPMENT PROCESS

BACKGROUND OF THE INVENTION

1. Field of the Invention

This invention relates generally to a method for defining features for a vehicle being designed and, more particularly, to a feature development process which is based on properly-defined requirements, and which results in features which are reusable across multiple vehicle designs.

2. Discussion of the Related Art

Modern vehicles are very complex assemblies of mechanical and electronic systems, and the process of defining the specifications for a vehicle and its requirements can be equally complex. A vehicle's systems are defined as groups of features, with each feature specification having multiple requirements. An example feature is a remote keyless entry, and each requirement will specify one operational characteristic of the feature. Even in an example like this where the feature and requirements may at first seem simple, in fact the requirements may come from different sources and be documented in different formats, and this leads to complications in capturing them accurately. In addition, different people may attribute a different meaning to a particular technical term or data item, and this difference in definition can create confusion and uncertainty in the requirements definition process.

Various computer tools and methods have been developed over the years to aid in the process of defining product features and capturing requirements. While each individual tool or method may be useful for some aspect of the feature definition process, they have not proven to be effective in delivering the desired end result—which is a set of feature definitions which are usable by any product development team, which are based on clear, concise and accurate requirements, and which contain only data which has been reviewed, tested, and approved by an appropriate corporate owner.

A need exists for a set of methods, and supporting software tools, to capture feature definitions, construct valid requirements, define terms and data elements clearly, and manage all of these documents and data in a repository which is available to everyone who needs to contribute to or use them.

SUMMARY OF THE INVENTION

In accordance with the teachings of the present invention, methods are disclosed for developing features to be used in an automobile design. The features are developed and documented in an architecture-independent manner, so that they can be used on any vehicle platform where appropriate. The feature development process includes using requirements which have been defined using formal methods, thereby assuring the quality of the requirements. The feature development process also includes the documentation and standardized use of all technical terms and data elements, the use of computer simulation models and hardware-in-the-loop simulations to verify the requirements, and review of a feature and its requirements by peer groups at various stages of the process. The result is a Feature Technical Specification which can be used by any product development team, and which contains only clear, concise and accurate requirements.

Additional features of the present invention will become apparent from the following description and appended claims, taken in conjunction with the accompanying drawings.

BRIEF DESCRIPTION OF THE DRAWINGS

FIG. 8 is a screen image of a data item detail template from a terms management software tool;

DETAILED DESCRIPTION OF THE EMBODIMENTS

The following discussion of the embodiments of the invention directed to a method for developing features to be used in an automobile design is merely exemplary in nature, and is in no way intended to limit the invention or its applications or uses.

The process of designing and developing a modern automobile is indeed a complex one. Competitive pressures and customer expectations have driven automakers to deliver more features at a lower price on an inflation-adjusted basis. Those same competitive pressures demand that automakers develop new vehicle programs in an increasingly fast time cycle. In order to complete a new vehicle development program in less than two years, as is now the industry benchmark, automakers must ensure that features to be included in vehicles are clearly specified and tested before a new vehicle program utilizes the features. This means that the features, such as a memory seat system or a rear window defogger, must be defined in terms of clear requirements, independent of the vehicle platform to which they will be applied.

While much progress has been made in shortening the time cycle for new vehicle development and improving the content and quality of the resultant vehicles, further improvements must be made. The methods of the present invention would allow an automaker to develop vehicle features in a platform-independent manner, define those features in terms of properly-constructed requirements, ensure that all technical terms and data elements are defined in a consistent and approved fashion, and organize all of the documents and data associated with the features and requirements in a way that it is accessible by anyone who needs to use it or contribute to it.

At this point it will be helpful to define some terminology as used in this disclosure. A system is comprised of one or more features. A feature is comprised of the software and hardware required to provide a unique vehicle operation. Both systems and features require a specification document. A specification is a structured document that dictates what is to be built by including drawings, documents, and requirements. A requirement is a unique, unambiguous, structured statement that is testable. A device is a physical item that performs an operation, with either hardware and/or software.

Figure 1:
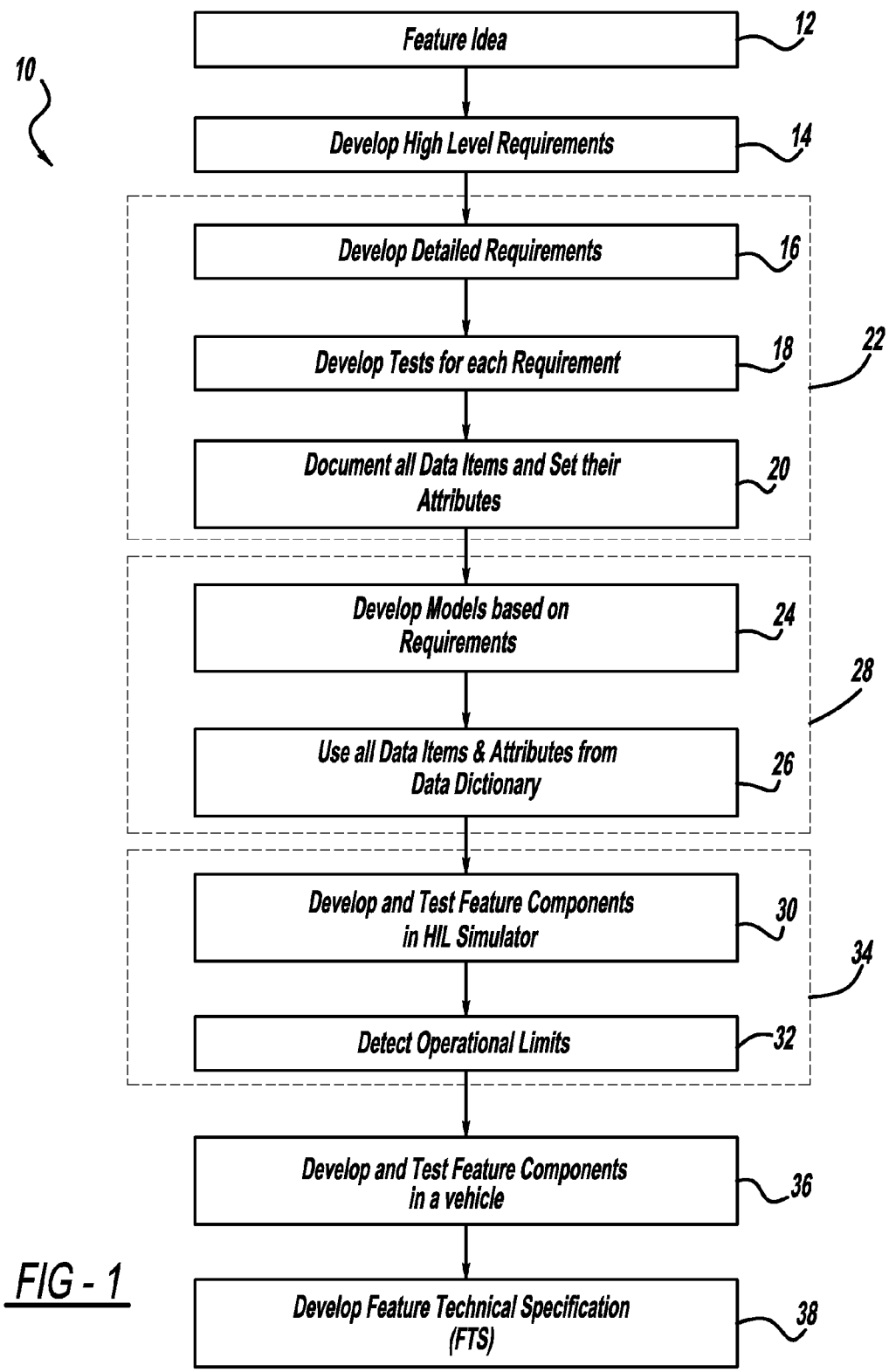
FIG. 1 is a flow chart diagram of a feature development process.

In order to achieve the goals described above, an overall process for feature development is needed. FIG. 1 is a flow chart diagram 10 of a feature development process. The process begins with a feature idea at box 12. The feature could be something new, like a vehicle navigation system would have been a few years ago, or it could be a new definition of an old feature, such as a windshield wiper system. The feature idea could come from any of a variety of sources, including internal company departments like marketing or engineering, or external sources such as customer feedback. Once a feature idea is captured, high level requirements are developed at box 14. The high level requirements should list the main characteristics of the feature by specifying the behaviors it is expected to exhibit. After a preliminary peer review and approval of the high level requirements, more detailed requirements are developed at box 16. At this point, the requirements should be developed using a formal requirements definition process, which will be discussed later.

In the realm of requirements definition, there are many different types of requirements and different levels of requirements that must be understood. Types of requirements include functional requirements, para-functional requirements, non-functional requirements, diagnostic requirements, hazard requirements, and others. Functional requirements describe what a system is supposed to do, but do not describe how to do it. For example, if a feature required that an engine speed stay below a certain number of revolutions per minute, the requirement would state that, but would not attempt to prescribe how the controller would implement this requirement. Para-functional requirements describe an environmental or supporting requirement rather than a function that the feature is to perform. An example of a para-functional requirement would be that a feature requires a voltage in the range of 12.0-14.5 volts dc in order to operate. Non-functional requirements address things like the reliability, maintainability, and fault tolerance of a feature. Diagnostic requirements define the capabilities needed for the diagnosis of problems and status of a feature. Hazard requirements address potentially hazardous consequences of possible failure conditions.

Levels of requirements include higher level, architecture-independent feature requirements, and lower level vehicle platform-specific implementation requirements. Architecture-independent feature requirements include user requirements, functional requirements, hazard requirements, diagnostic requirements, non-functional requirements, test cases, state transition diagrams, and context diagrams. Vehicle platform-specific implementation requirements include design requirements, hardware requirements, and updated versions of test cases, state transition diagrams, and context diagrams, along with lessons learned. Implementation requirements should be created from a copy of the feature requirements, so that the original higher level requirements are not lost or modified.

After functional and other requirements have been developed at the box 16, a test suite should be defined. This is done at box 18 by developing one or more tests for each requirement in the feature. At box 20, all data items which are used in the requirements are identified, and their attributes are defined. This is done to ensure that data elements are precisely defined, to eliminate any ambiguity. This precision is absolutely necessary in later stages of the process, where simulation models and eventually physical prototypes are built. The tasks of the boxes 16, 18, and 20 are completed as a group as shown by box 22. The activities within the box 22 represent the first comprehensive definition of a feature via the requirements, the associated data elements, and test cases. In the course of the detailed requirement and test case development activities in the box 22, a number of supporting documents will be created. These include state transition diagrams, context diagrams, use case descriptions, and a preliminary hazard analysis.

Figure 2:
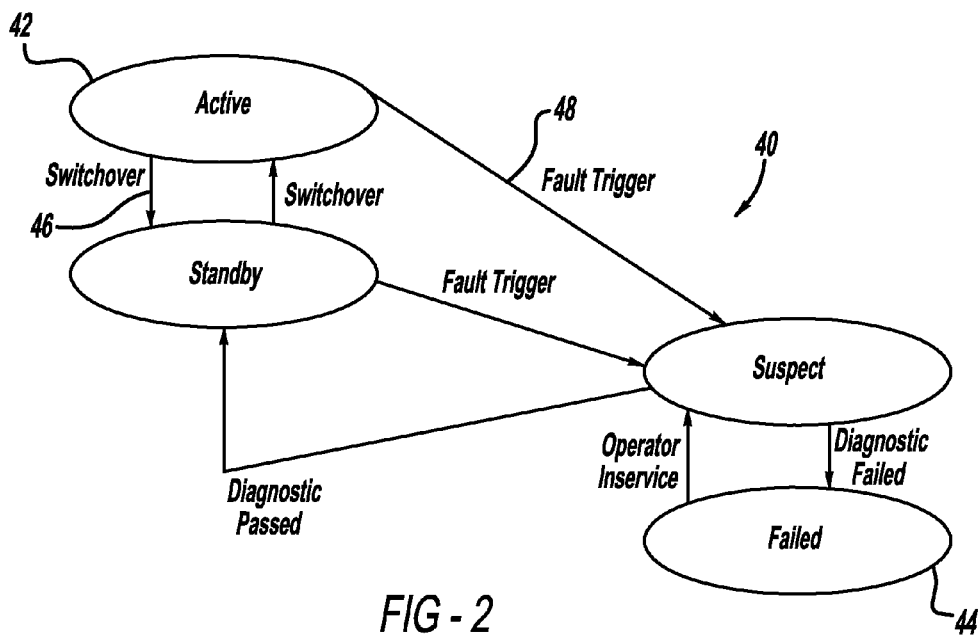
FIG. 2 is an example state transition diagram as used in the feature development process shown in FIG. 1.

A generic example of a state transition diagram 40 is shown in FIG. 2. A state transition diagram is a representation of the different states in which a system can exist, and the actions or events that cause the system to transition from one state to another. In the state transition diagram 40, examples of system states include an active state 42 and a failed state 44. Examples of actions and events include a switchover action 46 and a fault trigger event 48. This type of diagram is well known in the art.

Figure 3:
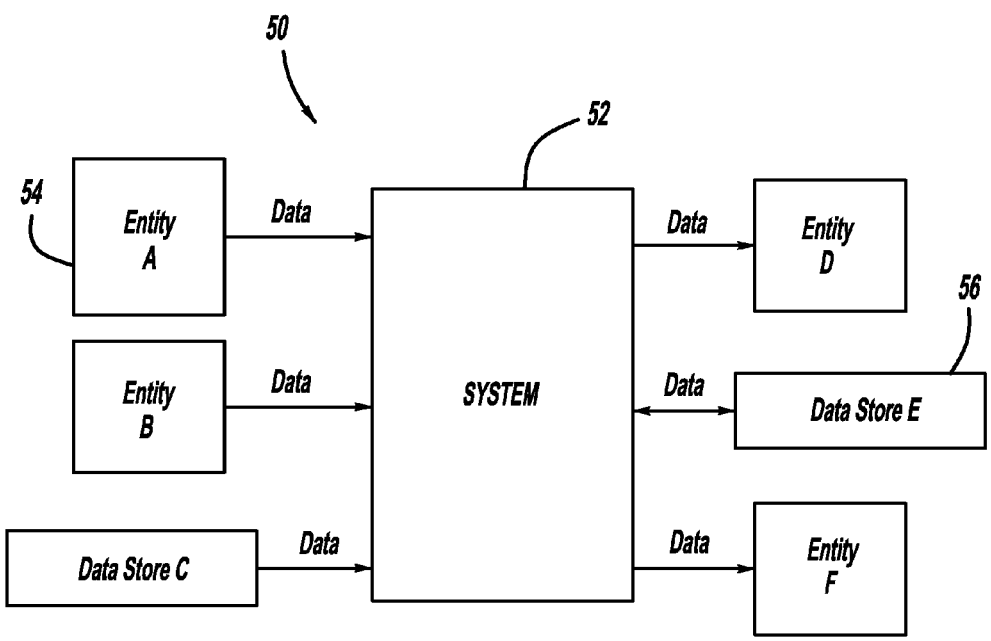
FIG. 3 is an example context diagram as used in the feature development process shown in FIG. 1.

A generic example of a context diagram 50 is shown in FIG. 3. A context diagram is a diagram used in systems design to represent the more important external factors that interact with the system at hand. This type of diagram usually pictures the system surrounded by its interacting systems, environment and activities. The objective of a context diagram is to focus attention on external actors and events that should be considered in developing a complete set of system requirements and constraints. In the context diagram 50, the system 52 is shown at the center, along with inputs, such as entity 54, and outputs, such as data store 56. This type of diagram is also well known in the art. A use case document describes who can do what with the system, and how the system will respond to the actions. A hazard analysis assesses risks associated with the system, and identifies means of controlling or eliminating them. These documents all support the detailed requirement definition, and will assist in the modeling and verification activities which will subsequently be undertaken.

At box 24, system simulation models are developed based on the detailed requirements as defined. The system simulation models may be of a variety of types, but a very commonly used and powerful type of model for simulating electronic systems and electronically controlled mechanical systems can be developed using the MATLAB/Simulink suite of software from The Mathworks. A system simulation model of this type can not only simulate the real-time behavior of the feature, but can also generate code in the form of software functional blocks to be used in an electronic control unit (ECU). Other types of models and simulations may also be used to analyze and verify the requirements as defined. The models are often used to execute the tests defined in the box 18, thus providing an opportunity to update and improve both the requirements and the test suite before the costly step of building hardware.

As shown at box 26, all data items and attributes used in the creation of the system simulation models should be defined in a central data dictionary. This ensures that the person who is building the models and analyzing the requirements is using only data items which have been reviewed and approved by appropriate peer groups. Also, as a result of the documentation of data items in the box 20 above, any new data item definitions which are needed for the feature's requirements and test cases will have been proposed for inclusion in the data dictionary, and will have either been accepted or modified. As indicated by box 28, the activities of the boxes 24 and 26 go together; that is, only data items retrieved from the central data dictionary should be used in the system simulation models and requirements.

After models have been created to simulate the behavior of the feature being developed, the models can be used in a hardware-in-the-loop (HIL) environment, as shown at box 30. In HIL simulations, the system simulation model is used to model the behavior of the control system, typically an electronic control unit. However, the device being controlled, often called the plant, is removed from the model and replaced with actual physical hardware in a laboratory environment. HIL testing provides a simulation environment which eliminates the approximation and uncertainty involved in modeling the plant. Using the actual physical hardware for the plant improves the fidelity of the simulation considerably for the selected hardware, especially where the plant is a complex mechanical system involving friction, backlash, compliance, and other nonlinearities which are very difficult to model accurately. If the feature doesn't perform well, different hardware may be tested until the desired performance is achieved. In the course of exercising the HIL simulator, operational limits for the feature will be detected, as shown at box 32. The operational limits include limits of the plant, such as range of motion, and other physical and functional limits. As operational limits are detected during HIL simulation, the limits should be added to the requirements definition. Box 34 shows that the operational limit detection of the box 32 is tied to the HIL simulation of the box 30. Another important result of the activities in the box 34 is the selection of hardware components such as sensors and actuators. The types, sizes, and ranges of motion of these components can be thoroughly evaluated with HIL simulation, and the results documented as part of the feature and requirements definition.

Upon completion of the HIL simulation in the box 30, the control system should be well defined. At that point, a prototype electronic control unit can be built, and it can be programmed with software functional blocks which in some cases may be generated by the simulation tools described above. In box 36, the feature under development can be tested in a vehicle. Vehicle-based testing provides the best simulation of how a feature will work in a real production vehicle environment. Although not all elements of the plant and the control system will be representative of production hardware at this stage, since the feature is being developed in a vehicle platform-independent manner, vehicle-based testing still provides insight beyond that available from laboratory-based HIL simulation. Advantages of vehicle-based testing include the use of real vehicle data networks and electrical busses, and the ability to actually drive a vehicle under a variety of test conditions rather than simulate those conditions in a laboratory setting. The hazard analysis document, created in a preliminary form at the box 22, would also be updated at the box 36.

As the feature development proceeds from the activities in the box 22, to the box 28, to the box 34 and onward, the requirements are reviewed by peer groups and approved by management stakeholders as appropriate. By the time the vehicle-based testing at the box 36 has been conducted, the definition of the feature and its supporting requirements should have reached a high level of quality and detail. At this stage, the Feature Technical Specification (FTS) can be developed at box 38. The FTS document is the culmination of the feature development process. The FTS includes; all requirements as defined and developed throughout the feature development process, all data elements from the data dictionary as needed to support the requirements, state transition diagrams, context diagrams, use cases, test procedures, hazard analyses, all models developed for system simulation, component selection and operational limit information developed during HIL simulation, and all lessons learned during development of the feature.

Many benefits can be realized from following the comprehensive feature development process. One main benefit is that a feature and its requirements can be defined, simulated, reviewed, and approved more thoroughly than with traditional piecemeal methods. The resultant documents, models, and simulation results provide a much more complete understanding of how a feature can and will work. Another benefit is that, once a feature system simulation model has been developed, it is possible to distribute the feature's functions across electronic control units which would be available in a vehicle, thus allowing existing ECU's to be used rather than requiring a new ECU to support a new feature. Also, during the feature development process, controller and software functional blocks can be defined such that they can be sourced from different vendors, and re-used by the automaker once developed. This is an important cost reduction strategy for the automaker. After using the vehicle platform-independent feature development process, the FTS document can be used by any vehicle development team, on any vehicle platform or architecture. By having features and their requirements fully defined and developed before a vehicle development program begins, the vehicle development process can be completed much more quickly, which is extremely important in today's marketplace.

Figure 4:
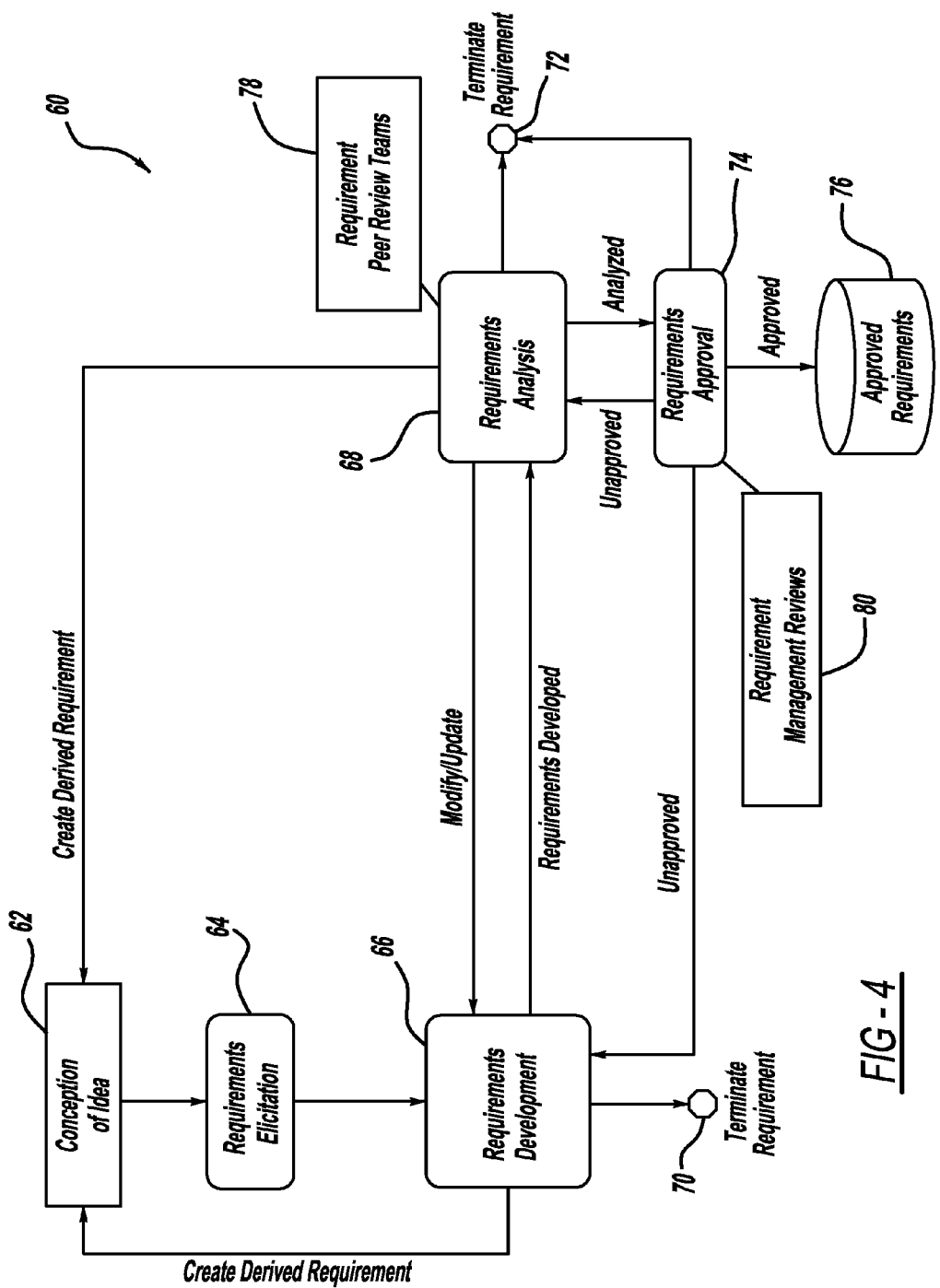
FIG. 4 is a flow chart diagram of a requirements engineering process.

Throughout the feature development process, the accurate definition of requirements is an important activity. It has been observed that, although most engineers and other people working on a product development can adequately describe requirements at a high level, detailed requirements are often documented in terms that may be unclear or ambiguous. It is for these reasons that a requirements engineering process and corresponding software tool have been developed. FIG. 4 is a flow chart diagram 60 of a requirements engineering process. At box 62 an idea is conceived. The idea could come from someone in a department internal to a company, such as engineering or marketing, or the idea could come from an external source, such as a customer. The idea could be for an all-new product feature, or it could be an idea for improvement of an existing feature. Regardless of the source or nature of the idea, the next activity is requirements elicitation at box 64. Requirements elicitation is the drawing out or bringing forth of requirements for a system or feature by discussing it with users, developers, and other stakeholders. Requirements elicitation provides a greatly expanded base of documentation for a feature idea, as compared to the idea conception itself which may be very brief and lacking in detail.

Box 66 encompasses requirements development, which is a significant activity in and of itself. Requirements development involves taking each raw requirement documented in the elicitation step and building it into a fully-developed requirements statement which follows certain rules for structure, meets standards of clarity, and assumes a certain format. The effort expended on requirements development is intended to ensure that requirements as documented are clear, concise, and accurate, and can be picked up and used by anyone at a later time with no misunderstanding. Development of proper requirements is important enough that a requirements engineering software tool has been created to support it. The tool is designed to make it easier and faster to develop requirements, and to improve the quality and consistency of the requirements that are created.

Figure 5:
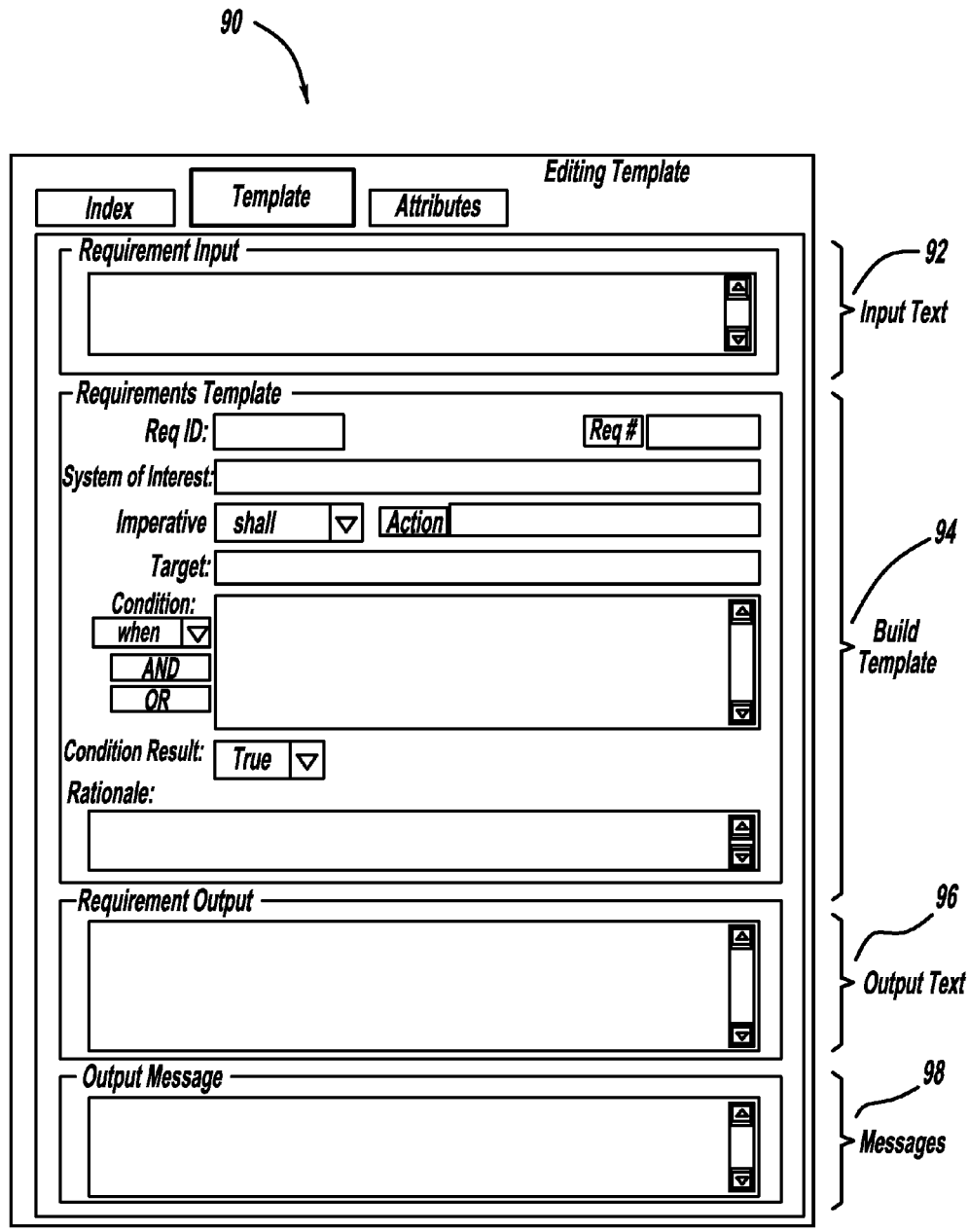
FIG. 5 is a screen image of a requirement editing template from a requirements engineering software tool.

FIG. 5 is a screen image of a requirement editing template 90 from the requirements engineering software tool. The requirement editing template 90 consists of several sections, and has an objective of limiting the allowable words in certain fields to improve clarity and understanding of requirements. Input text section 92 is where an initial textual definition of a requirement is displayed. The textual description of a requirement normally comes from an earlier activity such as the requirements elicitation or previous specifications, and describes what action should be taken by a certain system if or when a certain event occurs. The requirements engineering software tool includes a parser for pulling apart the input text and inserting pieces of the text into appropriate fields of a build template 94. The build template 94 includes numerous data fields, which are used to build each requirement in terms of specific elements and actions. Each requirement has a requirement identification (Req ID) and a requirement number (Req #). The requirement identification is simply a sequential numeric value used to uniquely identify each requirement. The requirement number is a code which is constructed to designate the type of requirement, for example, a user requirement or a hazard requirement, and also to designate the level of the requirement in the hierarchy of requirements.

System of interest designates what vehicle feature is the subject of this requirement. System of interest must be precisely defined. An imperative field and an action statement are then used in conjunction, such that the imperative field is the preamble for the action statement. The imperative value must be selected from a drop-list, with the allowable values being; shall, must, will, or should. The action field describes what action the system of interest is to take. Target is the device that is being acted upon. For example, the action might be to sound a chime using the vehicle speaker system, or to display an informational message to the driver on the dashboard display. A condition statement follows the action and target fields. The condition statement consists of at least two parts. The first part is a drop-list selection in which the most common value is when. The second part of the condition is a textual description of the condition being tested for—such as, the brake pedal is being depressed. It is also possible to define a compound condition statement, including more than one condition being tested for, joined by an 'and' operator or an 'or' operator. Finally, a condition result field is applied to the condition statement to determine whether the action is to be taken. For example, if the condition result is set to true, then the action will be taken in the event that the condition is found to be true. Condition result may also be set to false. The final part of the build template 94 is a rationale field, which is used for the requirement author to describe the reason behind the requirement. The textual description in the rationale field is often helpful for people other than the author who may read the requirement at a later date.

Output text field 96 is where the software tool re-writes the requirement based on the specific elements defined in the build template 94. To summarize, the requirement editing template 90 reads a textual requirement statement into the input text field 92, parses it into its components in the build template 94, allows the user to interactively update the requirement components in the build template 94, and the requirements engineering software tool writes the final form of the requirement in the output text field 96. The final form of the requirement will comply with all rules and standards for syntax, content, clarity, and format. It is important to note that a single original requirement from the input text field 92 may be broken by the software tool into two or more final requirements, such that each final requirement is a single, unambiguous testable statement about a vehicle feature. Other important requirement authoring rules are built into the software tool. These rules include; only positive statements of requirements are allowed, not negative statements; requirements can only be stated for outbound transitions from states, not inbound transitions; use 'when' rather than 'if-then' conditional requirements; and only one action statement per requirement is allowed. Finally, the software tool uses a messages field 98 to record informational messages about the requirement, which may be viewed by the author or others.

The requirements engineering software tool also contains an Index page for allowing users to search existing feature requirements, and an Attributes page for defining attributes of each requirement, such as requirement status and priority, authors, reviewers, and other attributes. The requirements engineering software tool also automatically scans requirements for data variables and, when parsing a requirement into its components, reconciles the variables with the central data dictionary. Automatic scanning for variables ensures that the central data dictionary is kept up to date with new requirements, and ensures that new requirements use existing variable names defined in the data dictionary.

Referring again to the flow chart diagram 60, the requirements engineering software tool described in the preceding paragraphs may be used to complete the requirements development activity of the box 66. It is not necessary to use the requirements engineering software tool, but the rules and methods embodied in the tool can help an author develop better requirements in less time. Box 68 is requirements analysis, where an analysis team will apply use cases, apply test cases, check data items, and perform other analyses to see if requirements as developed make sense. People doing analysis may send requirements back to development at the box 66. It is also possible to terminate a requirement, either from the development box 66 at terminus 70, or from the analysis box 68 at terminus 72. If a requirement is terminated, meaning it no longer makes sense in the context of the feature being developed, the requirement should be documented, including the reasons for its termination, so that information will be available if needed again in the future. Also, in the course of requirements development at the box 66 or requirements analysis at the box 68, additional requirements could be derived in relation to the original idea from the box 62. These derived requirements should flow back to the box 62 to be captured, expanded, developed, and analyzed. Requirements which have been analyzed at the box 68 can be sent on for approval at box 74. Approval of requirements is done by management stakeholders as appropriate for the requirement. Fully approved requirements pass on to a requirements repository at storage location 76, where they will be indexed and remain available for future use in a feature development or vehicle development program. Approvers may also choose to terminate a requirement, send a requirement back to analysis at the box 68, or send a requirement back for further development at the box 66. An organization may choose to have standing requirement peer review teams for requirement analysis as shown in box 78, and requirement management review and approval teams as shown in box 80.

Throughout the above discussion, the concept of a central data dictionary has been mentioned repeatedly. The importance of clearly listing vehicle features and functions, defining data items and their attributes, having a single standard meaning for technical terms, and a central listing of the meaning of all acronyms, cannot be overstated. For this reason, another software tool has been developed to manage all of this data in a central repository, make it available to everyone who needs to access it or contribute to it, and interface with other systems, such as the requirements engineering software tool.

Figure 6:
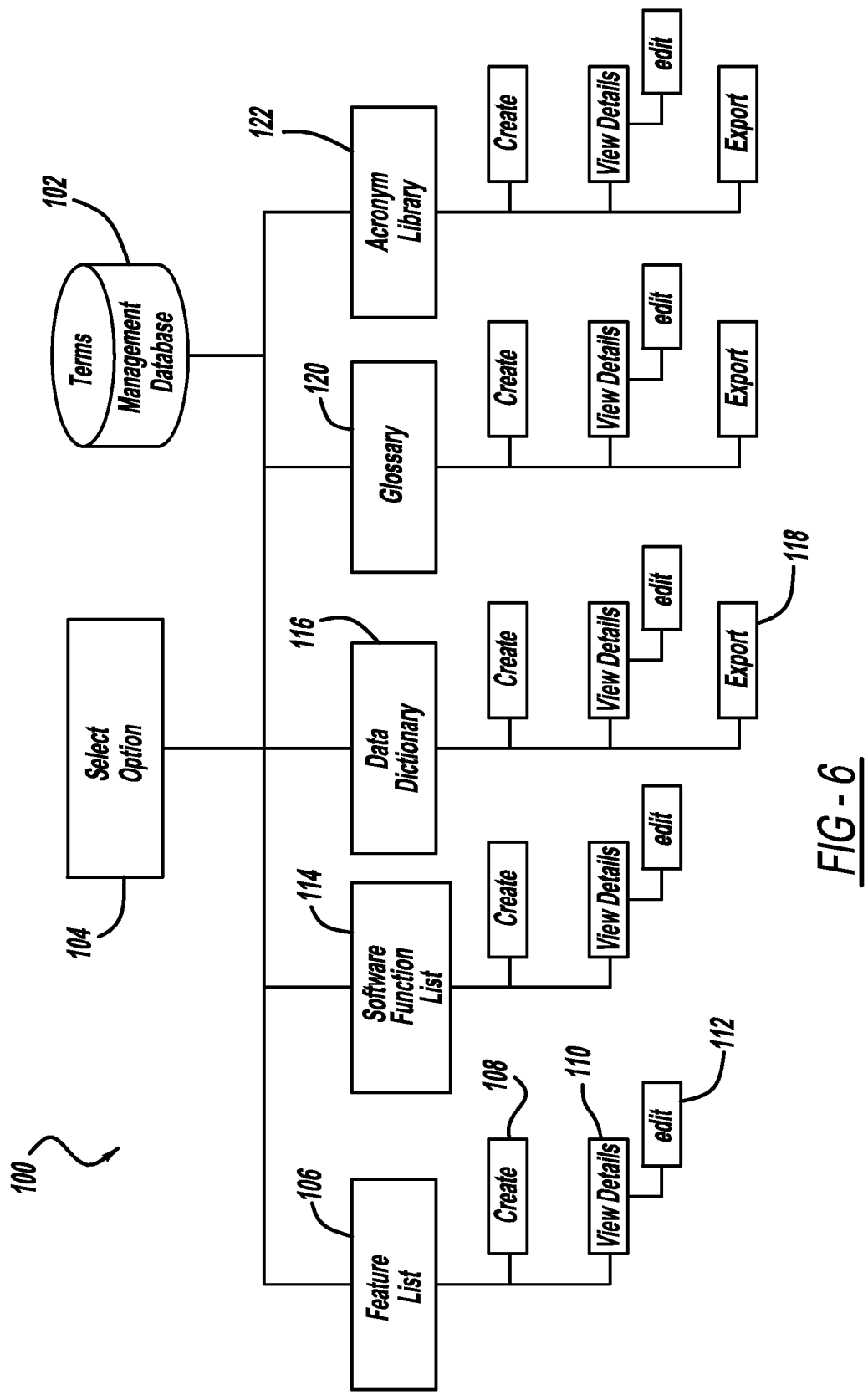
FIG. 6 is a block diagram of a software tool used for the management of data items, technical terms, and acronyms.

FIG. 6 is a block diagram of a terms management software tool 100. The terms management software tool 100 supports the definition of vehicle features, software functions, data items or variables, technical terms, and acronyms. All of these items, and their attributes and relationships, are contained in a terms management database 102. When a user starts the terms management software tool 100, he or she is asked to select an option as shown at box 104. If the user selects feature list 106, the terms management software tool 100 provides a list of all vehicle features contained in the database 102. A feature is a vehicle sub-system, such as a lane change warning or a memory seat feature, as was described in the feature development process previously. Each feature has a feature name, a description, an acronym, and the name of an organizational team which has ownership responsibility for that feature. A feature is composed of software functions, sensors, and actuators. While using the feature list 106, the user can create a new feature to add to the database 102, as shown at box 108. Details of any vehicle feature which exists in the database 102 can be viewed at box 110, or edited with appropriate authority at box 112, by selecting an item from the feature list 106.

Figure 7:
FIG. 7 is a screen image of a function definition template from a terms management software tool.

If the user selects software function list 114, the terms management software tool 100 will provide a list of software functions in the database 102. Selecting a function from the software function list 114 will enable the user to define the attributes of a function being defined, or view the details of an existing function. FIG. 7 is a screen image of a function definition template 126 from the terms management software tool 100. The function being defined in the template 126 is a software function which implements part of a feature. The function definition template 126 provides for the definition of all important attributes of a software function, in order to allow that function to be understood, interfaced with, or re-used by a person other than the creator of the function. A function name, a description, and a feature name are all mandatory fields, where the feature name identifies the feature which contains the function. The feature name is selected from a drop-list, which contains as options all of the features in the database 102, as described above. An ECU field is used to define which electronic control unit onboard a vehicle will contain the function, if this information is known. A task field identifies any related software functions which run at the same frequency as the function being defined. A memory type field is used to define what type of memory the function resides in. Memory type could be selected as RAM or EPROM, for example. Memory size is used to define how much memory is consumed by the function. Execution time indicates how long the function takes to run or execute. Frequency designates the time interval on which the function runs. A source field indicates where a source code file containing the function is stored. And a model field shows where a system simulation model containing the function is stored, if such a model exists.

Some of the most important information on the function definition template 126 is the identification of data items consumed by the function. An input variables section provides a candidate data items list which may be used to select input variables to the function. The candidate list is filtered for relevance based on the feature within which the function exists. From the candidate data items list, the user can select specific entries to be pulled over into an input variables list. The input variables list identifies which data items are actually used by the function. An output variables section works similarly to the input variables section, in that a candidate data items list is used to select actual output variables. In addition to the identification of input variables and output variables, other constants and variables used within the function but not input or output may be identified.

The input and output data variables described above are stored in the data dictionary part of the terms management software tool 100. Data dictionary 116 is a listing of all data items used in software functions, and attributes for each data item. When a data item is selected from the data dictionary 116, the details of that data item can be viewed and, with appropriate privileges, edited. FIG. 8 is a screen image of a data item detail template 130 from the data dictionary portion of the terms management software tool 100. The data item detail template 130 is used by a software function author to define the important attributes of a data item used in a software function, or by anyone else to view the attributes of a data item. A data item name and description are mandatory fields to complete when creating a new data item. It is also mandatory to define a data item category, which identifies the data item as either a constant or a variable. A type field is used to indicate the type of data item, which could be an integer type or a decimal type. A resolution field indicates the precision of the data item. A minimum value field and maximum value field contain the minimum and maximum allowable values of the data item, respectively. An initial value field indicates the value of the data item when the function begins, unless and until the data item is set to some other value. Fail soft value is used to designate a value of the data item to be used in the event that the function cannot compute a proper value of the data item due to a lack of input data or some other problem. If the data item is an array, an array checkbox can be used to so indicate. In the case of an array variable, the number of dimensions in the array can be defined in a dimensions field.

A descriptive name field provides a more descriptive alias that the data item can also be known as. An owner feature field indicates to which vehicle feature the data item belongs, with the value being selected from a list of vehicle features in the terms management database 102. A domain field is used to designate a group of features that the owner feature belongs to, if such a group exists. An example of a domain is a grouping of door lock features, for 2-door vehicles, 4-door vehicles, and 5-door vehicles. A checkbox labeled 'is Trigger' is used to indicate if a data item is used to trigger an action in a software function. Owner function indicates which software function owns the data item. A consumer functions field indicates which software functions use the data item. There may be zero, one, or more than one consumer function. The owner function and consumer functions fields are populated by selecting from the list of software functions in the terms management database 102. A memory field is used to identify how much memory is required for the owner function. Size indicates the size of the data item, in bits. A scale field may be used to define a scale factor to be multiplied by the data item, if needed. Period indicates how long the owner function takes to execute, in milliseconds. Finally, each data item has a unique identifier, version number, and owner.

The data dictionary 116 also offers an alphabetized list for quickly scanning through all data items. From the alphabetized list, an item can be clicked on to view the details, or to edit the item if the user has appropriate privilege. The alphabetized list shows the level of completeness of each data item via a red, yellow, or green indicator. At box 118, data items can also be exported from the data dictionary 116, for use in other applications.

Another important part of the terms management software tool 100 is a glossary 120. The glossary 120 is a library of globally defined and approved terms. In a large organization, it is critical to have a single approved definition for any technical term, readily available to anyone that needs it. In the terms management database 102, the glossary 120 includes a name of each term, a description of each term, a version number, and an approval status. The name may be more than one word. Only terms which have been reviewed and approved by an appropriate organizational team may be exported from the glossary 120 and used in a report. Where a term has a definition available from a standards organization or a government agency, that definition can be adopted and imported into the system, to avoid the need to create a definition.

The terms management software tool 100 also includes an acronym library 122. The acronym library 122 contains a name of each acronym being defined, its description or meaning, version information, and approval status. Like the glossary 120, a new entry to the acronym library 122 may be proposed by anyone in the organization, but it must be reviewed by an appropriate team and approved before it can be used by others. Throughout the terms management software tool 100, roles are assigned to individual users. Responsibility for approval can then be managed, thus preserving the integrity of the data entered.

The terms management software tool 100 provides numerous benefits to an organization seeking to standardize the usage of data items, technical terms, and acronyms, encourage the re-use of features and software functions which have been developed, and maximize the availability of all of this information to the people who need it. By storing all of this information in a single terms management database 102, the terms management software tool 100 can ensure the uniqueness of any feature, function, data item, technical term, or acronym. This eliminates the potential problem of multiple different definitions for a common data item or technical term. Also, by virtue of being the single recognized repository of this type of information, the terms management software tool 100 makes it easy for anyone in the organization to search for, find, and re-use any of these items. In addition, the relational information contained in the terms management software tool 100 helps users understand the context in which a data item or a function is used, and can even help users find information they did not know existed. For example, a user might be trying to create a new data item or variable name in the terms management software tool 100, find that a similar data item already exists, and then discover that a software function already exists which is very similar to the one which the user was in the process of creating. This sort of hierarchical linking can foster re-use and prevent re-work, in addition to eliminating ambiguity and misunderstanding. While all of the benefits described above could be realized through implementation of business processes, embodying those processes in a database-driven software system makes it much more efficient and effective.

Figure 9:
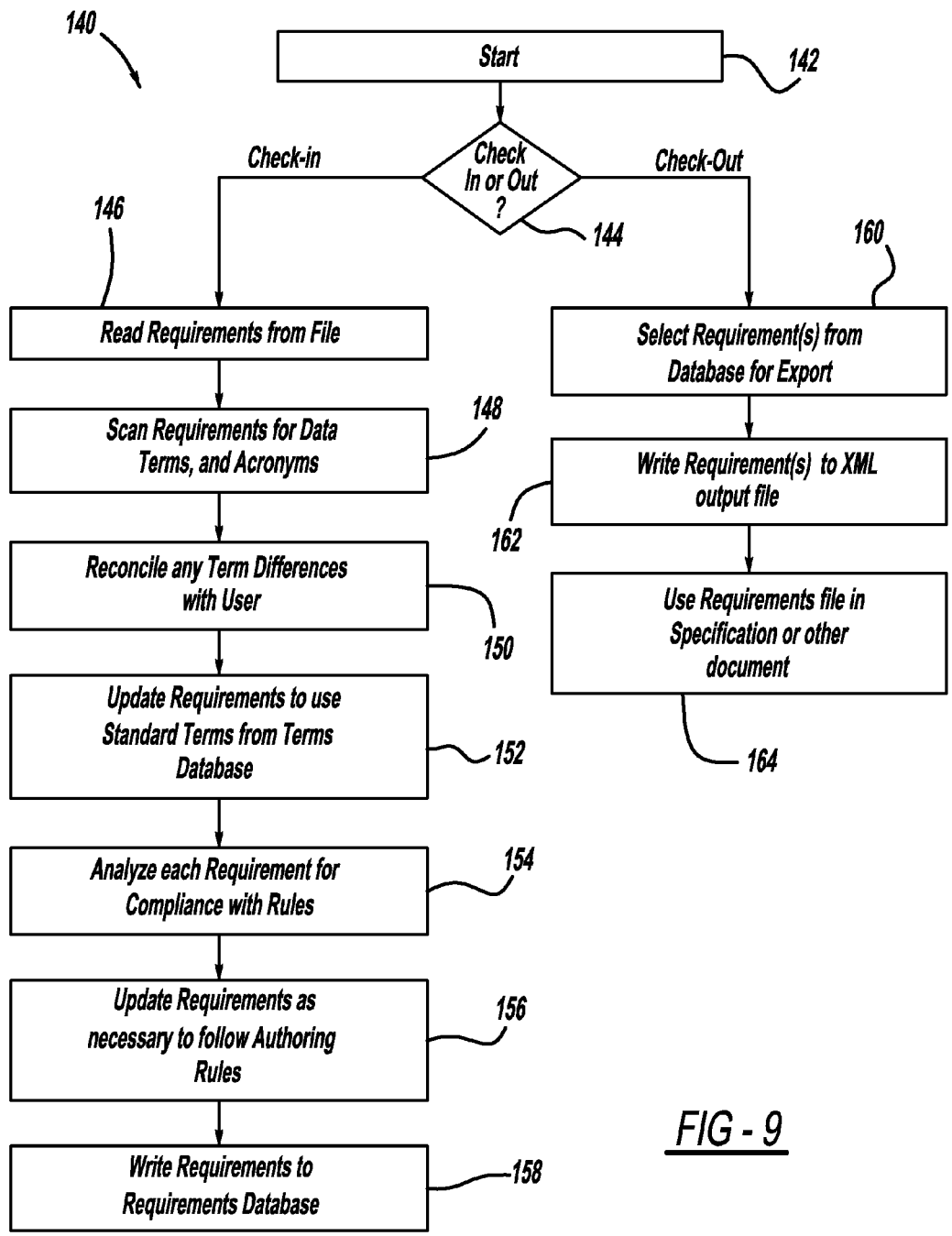
FIG. 9 is a flow chart diagram of a process for checking requirements into and out of a requirements repository.
Figure 10:
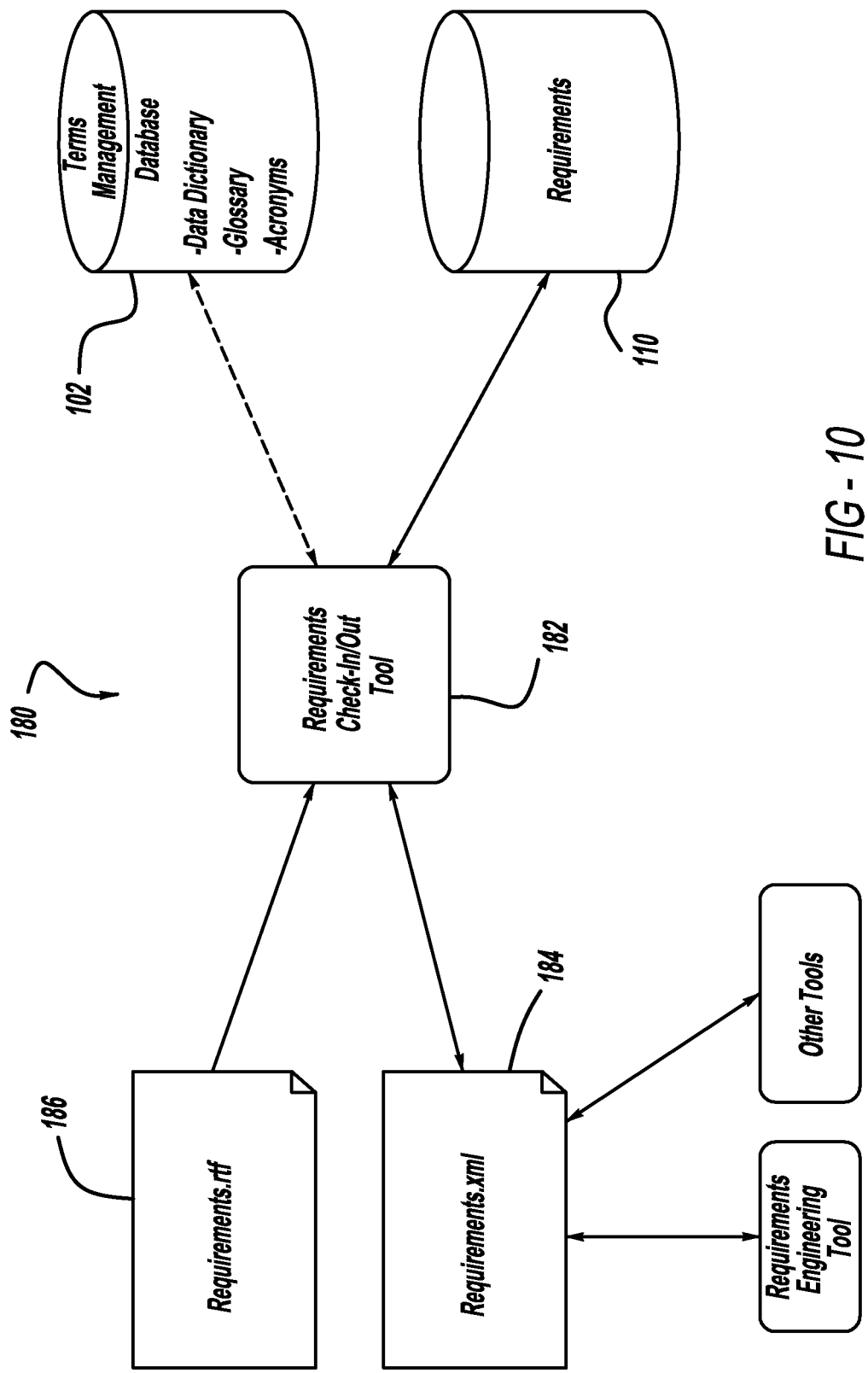
FIG. 10 is a block diagram of a software tool used for the requirements check-in and check-out process shown in the flow chart diagram of FIG. 9.

The processes and software tools described above for the development of requirements, and the management of associated features, functions, data items, technical terms, and acronyms, enable an organization to effectively create and approve those types of documents and data. However, in order to properly manage and use these items, and prevent proliferation, a method of cataloging the requirements and checking them for proper usage of standard terms is needed. FIG. 9 is a flow chart diagram 140 of a process for check-in and check-out of requirements to and from a repository, and FIG. 10 is a block diagram of a requirements management software system 180 which can be used for the check-in and check-out process. In the flow chart diagram 140, the process starts at box 142. At decision diamond 144 the user must indicate whether he or she wants to check requirements into the repository or check requirements out of the repository. If the check-in process is to be followed, then one or more requirements can be read from a file at box 146. In the requirements management software system 180, a requirements check-in/check-out tool 182 reads a requirements file as identified by the user. The requirements file can be either an xml (extensible mark-up language) formatted file 184, or an rtf (rich text format) file 186. The xml requirements file 184 could be generated by the requirements engineering software tool described previously, or could come from some other tool. The rtf requirements file 186 would most commonly contain requirements created using a word processing program.

Once the requirements are read from a file, the check-in/check-out tool 182 then scans the requirements for data items, technical terms, and acronyms at box 148. At box 150, the check-in/check-out tool 182 compares any data items, technical terms, and acronyms from the requirements as read against similar items in the terms management database 102 described previously, and interacts with the user to reconcile any differences. The following options are available to reconcile differences; add a data item, term, or acronym to the terms management database 102, subject to approval; modify the spelling of an item in the input requirements; change an item from the input requirements to match an item from the terms management database 102 as suggested by the tool 182; or identify a word as not being a data item, term, or acronym which needs to be matched. Once all data items, terms, and acronyms from the input requirements are reconciled with the terms management database 102, the requirements are updated as necessary to use standard terms from the database 102, at box 152. At box 154, each requirement is analyzed for compliance with requirements authoring rules as embodied in the requirements engineering software tool described previously. These are rules, such as only stating positive requirements, and only stating requirements for outbound transitions from states. If the input requirements need to be modified to comply with the authoring rules, this is done at box 156. Finally, at box 158, the new requirements as modified are written to a requirements database 190. The requirements database 190 is the requirement repository to be used by anyone wishing to contribute, review, or use requirements for vehicle features or software functions. Requirements are stored in the requirements database 190 as data fields—such as Imperative, Action, Target, and Condition—not merely as textual statements. By storing the requirements as data, the integrity of the validation activities is preserved.

If the check-out process is to be followed from the decision diamond 144, then at box 160 the user must select one or more requirements from the requirements database 190 for export. At box 162 the selected requirements, which have already been validated against the terms management database 102 and verified to be in compliance with the requirements authoring rules, are written to the xml file 184 by the check-in/check-out tool 182. At box 164, the requirements written to the xml file 184 can be used in a specification document, or for other purposes.

The methods and software tools described above represent a significant breakthrough in the development of reusable vehicle features, the definition of good requirements statements supporting the features, the management of data item attributes and term definitions used in documents and vehicle-embedded software, and the organization of all of these things in central repositories. It has been shown that using the methods and tools as described enables an organization to develop better products, and develop them faster, which are two important goals of any manufacturing company.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for developing features to be included in a product design, said method comprising:

capturing an idea for a feature to be developed;

developing high level requirements for the feature;
developing detailed requirements for the feature;
developing mathematical models based on the detailed requirements;
defining hardware components for the feature;
developing and testing the hardware components for the feature in a prototype of the product; and
developing a feature technical specification based on results from the mathematical models and results of the testing of the prototype, where the feature technical specification includes all high level requirements and detailed requirements for the feature, approved data items from a data dictionary, approved technical terms from a glossary and approved acronyms from an acronym library, one or more state transition diagram, one or more context diagram, diagnostics, test procedures and use cases for the feature, a hazard analysis document, all mathematical models developed to simulate the detailed requirements, and all software functional blocks.

2. The method of claim 1 wherein developing detailed requirements for the feature includes:
defining a plurality of detailed requirements for the feature;
developing at least one test for each detailed requirement; and
documenting all data items, technical terms, and acronyms used in the detailed requirements.

3. The method of claim 2 wherein the detailed requirements include functional requirements, non-functional requirements, and para-functional requirements.

4. The method of claim 2 wherein documenting all data items, technical terms, and acronyms used in the detailed requirements includes documenting attributes for all data items, definitions for all technical terms, and meanings for all acronyms, and comparing the data items, technical terms, and acronyms with entries in a terms management data repository.

5. The method of claim 4 wherein the terms management data repository contains approved data items and attributes in a data dictionary, approved technical terms and definitions in a glossary, and approved acronyms and meanings in an acronym library.

6. The method of claim 1 wherein developing mathematical models based on the detailed requirements includes using only approved data items from a data dictionary.

7. The method of claim 6 further comprising generating software functional blocks from the mathematical models.

8. The method of claim 1 wherein defining hardware components for the feature includes testing the hardware components in a hardware-in-the-loop simulator, and detecting operational limits of the components.

9. The method of claim 1 wherein the product design is an automobile or automobile system.

10. A method for developing features to be included in an automobile design, said method comprising:
capturing an idea for a feature to be developed;
developing high level requirements for the feature;
developing detailed requirements for the feature;
developing mathematical models based on the detailed requirements, using only approved data items from a data dictionary;
defining hardware components for the feature;
developing and testing the hardware components for the feature in a vehicle; and
developing a feature technical specification based on results from the mathematical models and results of the testing of the prototype, where the feature technical specification includes all high level requirements and detailed requirements for the feature, approved data items from a data dictionary, approved technical terms from a glossary and approved acronyms from an acronym library, one or more state transition diagram, one or more context diagram, diagnostics, test procedures and use cases for the feature, a hazard analysis document, all mathematical models developed to simulate the detailed requirements, and all software functional blocks.

11. The method of claim 10 wherein developing detailed requirements for the feature includes:
defining a plurality of detailed requirements for the feature;
developing at least one test for each detailed requirement; and
documenting all data items, technical terms, and acronyms used in the detailed requirements.

12. The method of claim 11 wherein documenting all data items, technical terms, and acronyms used in the detailed requirements includes documenting attributes for all data items, definitions for all technical terms, and meanings for all acronyms, and comparing the data items, technical terms, and acronyms with entries in a terms management data repository which contains approved data items and attributes in a data dictionary, approved technical terms and definitions in a glossary, and approved acronyms and meanings in an acronym library.

13. The method of claim 12 further comprising generating software functional blocks from the mathematical models.

14. A method for developing features to be included in a product design, said method comprising:
capturing an idea for a feature to be developed;
developing high level requirements for the feature;
developing detailed requirements for the feature, including functional requirements, non-functional requirements, and para-functional requirements;
developing mathematical models based on the detailed requirements, using only approved data items from a data dictionary;
generating software functional blocks from the mathematical models;
defining hardware components for the feature including testing the hardware components in a hardware-in-the-loop simulator, and detecting operational limits of the components;
developing and testing the hardware components for the feature in a prototype of the product; and
developing a feature technical specification based on results from the mathematical models and results of the testing of the prototype, where the feature technical specification includes all high level requirements and detailed requirements for the feature, approved data items from a data dictionary, approved technical terms from a glossary and approved acronyms from an acronym library, one or more state transition diagram, one or more context diagram, diagnostics, test procedures and use cases for the feature, a hazard analysis document, all mathematical models developed to simulate the detailed requirements, and all software functional blocks.

15. The method of claim 14 wherein developing detailed requirements for the feature includes:
defining a plurality of detailed requirements for the feature;
developing at least one test for each detailed requirement; and
documenting all data items, technical terms, and acronyms used in the detailed requirements.

16. The method of claim 15 wherein documenting all data items, technical terms, and acronyms used in the detailed requirements includes documenting attributes for all data items, definitions for all technical terms, and meanings for all acronyms, and comparing the data items, technical terms, and acronyms with entries in a terms management data repository.

17. The method of claim 16 wherein the terms management data repository contains approved data items and attributes in a data dictionary, approved technical terms and definitions in a glossary, and approved acronyms and meanings in an acronym library.

* * * * *